United States Patent [19]
Yamazaki et al.

[11] Patent Number: 5,430,323
[45] Date of Patent: Jul. 4, 1995

[54] INJECTION CONTROL-TYPE SCHOTTKY BARRIER RECTIFIER

[75] Inventors: Tomoyuki Yamazaki; Naoki Kumagai, both of Kawasaki, Japan

[73] Assignee: Fuji Electric Co., Ltd., Kanagawa, Japan

[21] Appl. No.: 129,399

[22] Filed: Sep. 30, 1993

[30] Foreign Application Priority Data

Oct. 2, 1992 [JP] Japan .................... 4-263946
Nov. 18, 1992 [JP] Japan .................... 4-307385

[51] Int. Cl.$^6$ ............... H01L 27/095; H01L 29/48; H01L 29/94; H01L 29/76
[52] U.S. Cl. .................... 257/471; 257/288; 257/368; 257/476
[58] Field of Search ............. 257/471, 476, 368, 288

[56] References Cited

U.S. PATENT DOCUMENTS

| | | | |
|---|---|---|---|
| 5,063,428 | 11/1991 | Schlangenotto et al. | 257/471 |
| 5,081,509 | 1/1992 | Kozaka et al. | 257/471 |

FOREIGN PATENT DOCUMENTS

| | | | |
|---|---|---|---|
| 0134456A2 | 3/1985 | European Pat. Off. | 257/471 |
| 0205217A2 | 12/1986 | European Pat. Off. | 257/471 |
| 0372428A1 | 6/1990 | European Pat. Off. | 257/471 |
| 0450306A1 | 10/1991 | European Pat. Off. | 257/471 |
| 0506450A2 | 9/1992 | European Pat. Off. | 257/471 |
| 3443854A1 | 6/1985 | Germany | 257/471 |
| 3633161A1 | 4/1988 | Germany | 257/471 |
| 2-91975 | 3/1990 | Japan | 257/471 |
| 2150753 | 7/1985 | United Kingdom | 257/471 |

OTHER PUBLICATIONS

Baliga, B. J., "Analysis of Junction-Barrier-Controlled Schottky (JSB) Rectifier Characteristics", pp. 1089–1093, Solid-State Electronics, vol. 28, No. 11, (1985).

Baliga, B. J., "Analysis of a High-Voltage Merged p-i-n/Schottky (MPS) Rectifier", pp. 407–409, IEEE Electron Device Ltrs., vol. EDL-8, No. 9, Sep. 1987.

*Primary Examiner*—Steven Ho Yin Loke
*Attorney, Agent, or Firm*—Spencer, Frank & Schneider

[57] ABSTRACT

An injection control-type Schottky barrier rectifier, including: a semiconductor region having a first conductivity type; a first diffusion region, which is formed in the semiconductor region and which has a second conductivity type, the second conductivity type being different from the first conductivity type, for forming a depletion layer in the semiconductor region when a turn-off voltage is applied to the Schottky barrier rectifier; a second diffusion region, which is formed in the semiconductor region and which has the second conductivity type, for causing conductivity modulation in the semiconductor region when a turn-on voltage is applied to the Schottky barrier rectifier; a barrier electrode which is ohmically connected with the first diffusion region and which forms a Schottky junction with the surface of the semiconductor region which is opposite to the second diffusion region with respect to the first diffusion region; a gate insulator film formed on the surface of the semiconductor region between the first diffusion region and the second diffusion region; a gate electrode disposed in contact with the gate insulator film; a control terminal which is connected with the gate electrode and which applies an electrical voltage to the gate electrode to electrically connect or disconnect the first and second diffusion regions to or from each other; a main terminal connected to the barrier electrode; and a metal electrode disposed on the back surface of the semiconductor region.

12 Claims, 4 Drawing Sheets

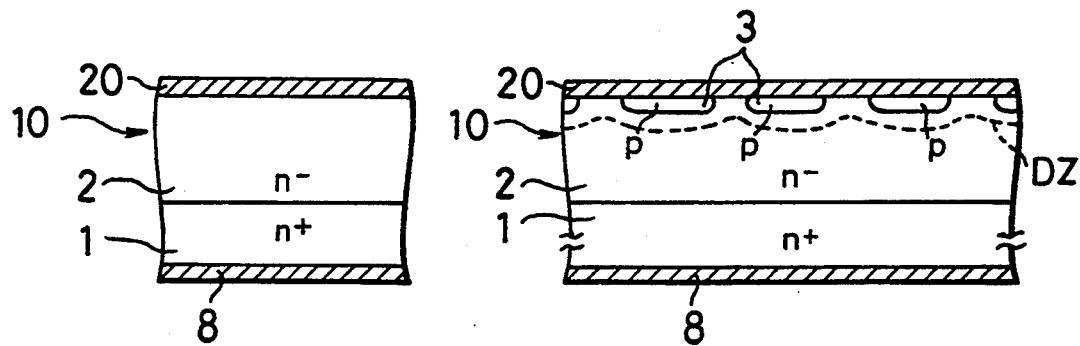
FIG.1A
(PRIOR ART)
FIG.1B
(PRIOR ART)
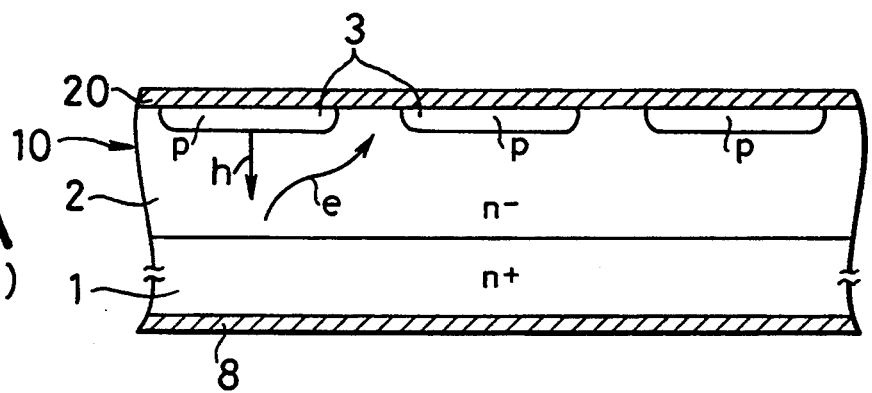
FIG.2A
(PRIOR ART)
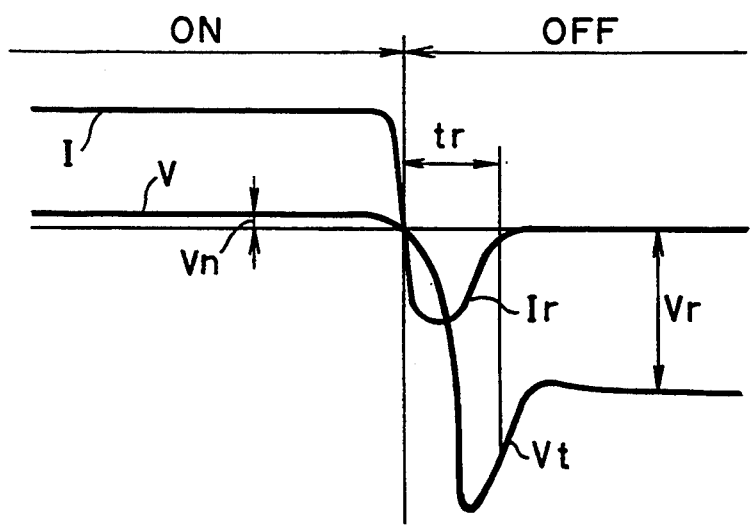
FIG.2B
(PRIOR ART)

INJECTION CONTROL-TYPE SCHOTTKY BARRIER RECTIFIER

BACKGROUND OF THE INVENTION

1. Field of the Invention

The present invention relates to a Schottky barrier rectifier, and more specifically to a Schottky barrier rectifier suitable for a power supply.

2. Description of the Prior Art

As is well known, a Schottky barrier diode is characterized by a low forward voltage and a high speed performance, and is thus suitable for supplying a large current with a low voltage. However, it is not suitable for high withstanding voltage because it involves disadvantages such as a great leakage current and others. Hence, various attempts have been made to improve its withstanding voltage characteristics by introducing therein the high withstanding voltage characteristics of a pin type diode. A typical example of a conventional Schottky barrier diode will be described with reference to FIGS. 1A to 2B.

FIG. 1A is a cross-sectional view showing a Schottky barrier diode with the simplest structure indicated for referential purposes. A barrier electrode 20, such as chromium, is disposed on the surface of an $n^-$ type epitaxial layer 2 of a wafer or chip 10 such that the barrier metal contacts the epitaxial layer 2. An electrode membrane 8 is disposed on an $n^+$ type substrate 1 of a high impurity concentration. When the diode is allowed to conduct with the barrier electrode 20 as a positive-side terminal and the electrode membrane 8 as a negative-side terminal, its forward voltage is very low. If a reverse bias is applied, however, there will be a large leakage current as stated previously. In this diode, the $n^-$ layer 2 must have a high specific resistance and a large thickness for withstanding a high voltage, but this results a very high forward voltage. Accordingly, the conventioned Schottky barrier diode is unsuitable for a high withstanding voltage.

A conventional example as illustrated in FIG. 1B is provided with pn junctions formed by diffusion of p regions 3 to have a low leakage current characteristics when reversely biased. An $n^-$ type epitaxial layer 2 is grown on an $n^+$ type substrate 1 of a chip 10. On the surface of the epitaxial layer 2 as a resistive semiconductor region, there are formed a plurality of p type diffusion regions 3 spaced from each other, and a barrier electrode 20 is further provided thereon. The barrier electrode 20 is conductively connected with the p type diffusion regions 3, and forms a Schottky junction with the semiconductor region 2. Since the p type diffusion regions 3 form pn junctions with the semiconductor region, by suitably setting the depth of the p type regions and the space between the adjacent p type diffusion regions 3, a depletion layer DZ is spread from the p type diffusion region 3 to the surface portion of the semiconductor region 2 upon the application of a reverse voltage. As a result, the region 2 is pinched off by the depletion layer whereby a reverse leakage current is decreased. However, when the diode illustrated in FIG. 1B is designed for high withstanding voltage the epitaxial layer 2 also should be made to have a high specific resistance and a large thickness and as a result the forward voltage becomes high and the loss in ON state increases.

FIG. 2A is a cross-sectional view of a diode of an SPiN type. With this diode, the characteristics of a pin type diode are combined with those of a Schottky barrier diode so that the above-described problems can be solved. As illustrated in the drawing, its structure is the same as that of the diode shown in FIG. 1B, except that the right-to-left dimensions of the p type diffusion region 3 are greater than in FIG. 1B. Because of this arrangement, the flow of the electron e in the n type semiconductor region 2 is markedly curved, and there is a drop in the potential at the underside of the central portion of the bottom of the p type diffusion region 3 in the semiconductor region 2. Thus, the pn junction between the p type diffusion region 3 and the semiconductor region 2 is forward biased, and the hole h is injected from the p type diffusion region 3 into the semiconductor region 2 as illustrated.

In the semiconductor region 2 where the hole h is injected, the number of carriers sharply increases owing to conductivity modulation, thereby contributing to a current. Hence, the apparent resistance of the diode, accordingly the forward voltage in the ON state, decreases. In the OFF state of the diode, the depletion layer DZ extends in the surface portion of the semiconductor region 2 lying between the p type diffusion regions 3, as in FIG. 1B. This means that the SPiN type diode of FIG. 2A is suitable for a high withstanding voltage, and can suppress the increase in the forward voltage associated with its high speed operation, by relying on the conductivity modulation effect.

As described above, it is possible to decrease the leakage current of a Schottky barrier diode by incorporating the characteristics of a pin type diode. It is also possible to maintain a balance between the operating speed and the forward voltage of the diode by utilizing a conductivity modulation effect. However, when it is made to have a high withstanding voltage characteristics a current also flows when the reverse voltage is applied due to excess carriers which don't disappear and remain in the OFF state as in the case of a pin type diode. Because of this a power loss, a switching loss, during a transient reverse recovery action performed from the ON state until the OFF state of the diode.

FIG. 2B shows the above behavior by way of the waveforms of voltage, V, and current, I, obtained when the diode of FIG. 2A changes from the ON state to the OFF state. The voltage V changes from a low ON-voltage, Vn, to a reverse voltage, Vr, via a transient voltage, Vt, which is dependent on the circuit conditions, etc. of the circuit to which the diode is connected. During this period, the depletion layer DZ widens, and a reverse recovery time, tr, is taken until a stable OFF state is reached. During this time, the current I changes from a large ON-current to zero. However, a current with the reverse direction, so-called reverse recovery current, based on charge migration flows in a transient condition persistent until the depletion layer DZ completely broadens. This current serves as a reverse current, Ir, and the time integral of the product of the reverse current Ir and the transient voltage Vt constitutes a power loss associated with the ON-OFF switching action of the diode.

This switching loss, needless to say, occurs at each ON-OFF operation of the diode, and slightly differs depending on the conditions of the circuit to which the diode is connected. However, the loss becomes enormous in proportion to the frequency of the circuit used. Hence, the applicable frequencies are limited by high frequency loss, with the high speed performance of this kind of diode not being effectively used.

SUMMARY OF THE INVENTION

The present invention has been accomplished with a view to solving the above-mentioned problems. Its object is to decrease the switching loss of a Schottky barrier diode during its reverse recovery, while making the most use of its characteristics.

There is provided an injection control type Schottky barrier rectifier comprising:

a semiconductor region of a first conductivity type;

a first diffusion region formed in the semiconductor region and having a second conductivity type different from the first conductivity type for forming a depletion layer in the semiconductor region when the Schottky barrier rectifier is off;

a second diffusion region formed in the semiconductor region and having the second conductivity type for causing conductivity modulation in the semiconductor region when the Schottky barrier rectifier is on;

a barrier electrode which is conductively connected with the second diffusion region and which forms a Schottky junction with the surface of the semiconductor region opposite to the second diffusion region with respect to the first diffusion region;

a gate insulator film formed on the surface of the semiconductor region between the first diffusion region and the second diffusion region;

a gate disposed in contact with the gate insulator film;

a control terminal which is connected with the gate, and which applies an electrical voltage to the gate to electrically connect or disconnect the first and second diffusion regions to or from each other;

a main terminal connected to the barrier electrode; and a metal electrode disposed on the back surface of the semiconductor region.

Here, a plurality of the first diffusion regions, the second diffusion regions, the gates and the control terminals may be provided.

The first diffusion region, the second diffusion region, the gate and the semiconductor region below the gate may constitute a field effect transistor.

The semiconductor region in the vicinity of the gate may form a channel with a length of 5 $\mu$m or less.

The length of the channel may be 2 $\mu$m or less.

The semiconductor region in the vicinity of the gate may form a channel, and when the Schottky barrier rectifier is on, an electrical voltage for making the channel conductive may be applied to the gate; and before the Schottky barrier rectifier does an OFF-action, an electrical voltage for bringing the channel to a non-conducting state may be applied to the gate.

The semiconductor region may be made of n type Si, and the first and second diffusion regions may be each of a p type.

The barrier electrode may be a composite membrane of a barrier metal, such as chromium or titanium, and aluminum.

The depth of the second diffusion region may be greater than the depth of the first diffusion region.

A buried layer of the second conductivity type continuous with the second diffusion region may be provided in the semiconductor region so as to nearly cover the first diffusion region from below via the semiconductor region.

The first and second diffusion regions may have substantially the same depth, and a well layer of the first conductivity type having a higher impurity concentration than that of the semiconductor region may be provided below the first diffusion region so as to cover all of the undersurface of the first diffusion region, except its side surface opposite to the second diffusion region.

The second diffusion region may be a buried layer formed in the semiconductor region; the first diffusion region may be formed above the second region via the semiconductor region; the gate insulator film may be an oxide formed on the side surfaces and bottom surface of a trench formed in the semiconductor region so as to reach the second diffusion region; and the gate may fill the trench.

If the Schottky barrier rectifier must withstand several hundred volts, it should have a considerably high-resistance semiconductor region consisting of Si with a specific resistance of several $\Omega$cm or more. That channel below the gate which is formed in the surface portion of the semiconductor region between the first diffusion region and the second diffusion region should advantageously have a short length of several micrometers or less to decrease the ON-resistance. The time during which the channel is in non-conducting state prior to the OFF-action of the Schottky barrier rectifier should be set from several hundreds of nanoseconds to several tens of microseconds.

The Schottky barrier rectifier of the present invention has first and second diffusion regions of a second conductivity type instead of a conventional diffusion region in a pin or SPiN type. The first diffusion region is provided with the effect of widening a depletion layer for high withstanding voltage. The second diffusion region is provided with the effect of causing conductivity modulation for decreasing forward voltage. The first and second diffusion regions can be electrically connected with or separated from each other by gate control. In the ON state of the Schottky barrier rectifier, the second region is electrically connected with the first diffusion region to maintain conductivity modulation within the semiconductor region below them, thereby decreasing forward voltage. Immediately before the OFF-action, the second diffusion region is electrically separated from the first diffusion region to terminate conductivity modulation, thereby decreasing the number of carriers within the region where the depletion zone should be widened during reverse recovery. Subsequently, OFF-action is performed, whereby the reverse recovery current is decreased to decrease the switching loss.

The above and other objects, effects, features and advantages of the present invention will become more apparent from the following description of embodiments thereof taken in conjunction with the accompanying drawings.

BRIEF DESCRIPTION OF THE DRAWINGS

FIG. 1A is a partially enlarged cross-sectional view of a conventional Schottky barrier diode.

FIG. 1B is a partially enlarged cross-sectional view of another conventional Schottky barrier diode.

FIG. 2A is a partially enlarged cross-sectional view of a conventional SPiN type Schottky barrier diode.

FIG. 2B is a diagram showing the waveforms of voltage and current of the diode illustrated in FIG. 2A.

FIGS. 3A to 3C are views illustrating the actions of the Schottky barrier rectifier in accordance with the present invention, in which FIG. 3A is a cross-sectional view of its unit structure, FIG. 3B is a diagram showing the waveform of gate voltage, and FIG. 3C is a diagram showing the waveforms of voltage and current of the rectifier.

DETAILED DESCRIPTION OF THE PREFERRED EMBODIMENTS

Figure 3A:
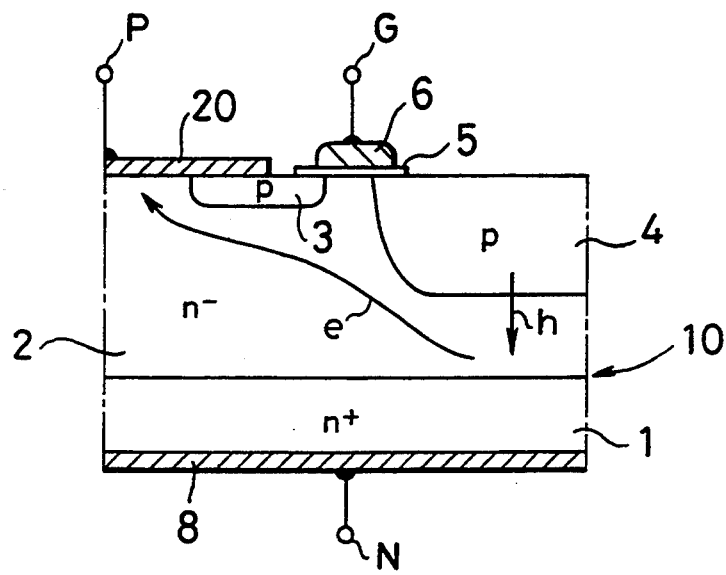
Figure 3B:
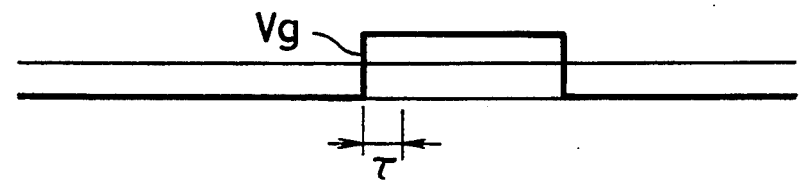
Figure 3C:
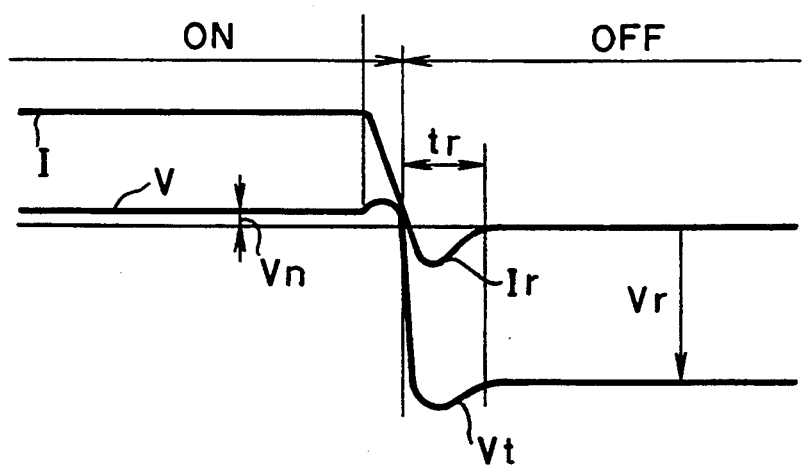
Figure 4:
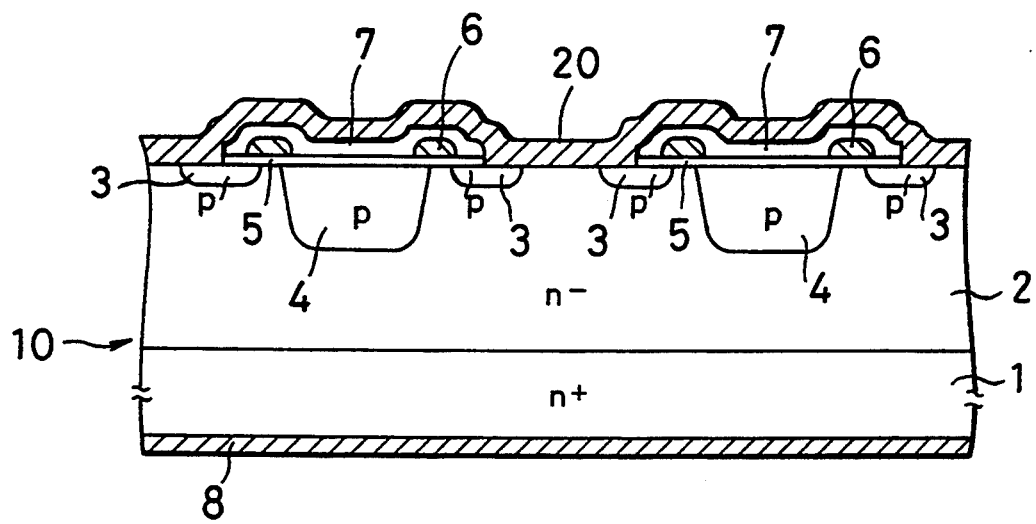
FIG. 4 is a partially enlarged cross-sectional view of a rectifier showing an embodiment of the present invention.

The actions of an example of an injection control type Schottky barrier rectifier in accordance with the present invention will be described with reference to FIGS. 3A to 3C. FIG. 3A shows the unit structure of the example of the Schottky barrier rectifier. Actually, the illustrated structure recurs symmetrically in the right-left direction of the drawing as indicated in FIG. 4. A semiconductor region 2 on an n+ substrate 1 of a chip 10 is normally of an n− type as illustrated. A p type first diffusion region 3 and a p type second diffusion region 4 deeper than the first diffusion region 3 are formed, for example, by thermal diffusion or ion implantation and diffusion. The first diffusion region 3 and the second diffusion region 4 each form a pn junction with the semiconductor region 2. Above the narrow upper portion of the semiconductor region 2 between the two regions is disposed a gate 6 via a gate insulator film 5. A barrier electrode 20 is provided so as to form a Schottky barrier junction with the semiconductor region 2 and to be conductively connected with the first diffusion region 3. A main terminal, P, on the positive side of the rectifier is led from the barrier electrode 20. A main terminal, N, on the negative side of the rectifier is led from an electrode membrane 8 conductively connected to the substrate 1 beneath the semiconductor region 2. A control terminal G is led from the gate 6.

A field effect transistor comprising the first and second diffusion regions 3, 4 of a p type, the surface portion of the semiconductor region 2 of an n type interposed between the two diffusion regions, and the gate 6 laid thereon is of a p-channel type. When the control terminal G is brought to a negative potential relative to the positive-side main terminal P, the field effect transistor is turned on, whereby the diffusion regions 3 and 4 are electrically connected to each other and have the same potential. As shown in FIG. 3B, when the positive gate voltage Vg is applied, the field effect transistor is turned off, whereby the two diffusion regions are electrically disconnected from each other.

In the present invention, when the Schottky barrier rectifier is biased in forward direction, the field effect transistor is turned on so that the potential of the positive-side main terminal P is applied to the second diffusion region 4. On this occasion, since the second diffusion region 4 is diffused more deeply, the injection of holes, h, into the semiconductor region 2 present beneath it occurs from the second diffusion region 4. As a result, an electric current of electrons, e, flows toward the positive-side main terminal P. In this ON state, the Schottky barrier rectifier becomes conductive with the lower forward voltage Vn of FIG. 3C, while the injection of holes does not occur from the first diffusion region 3.

According to the present invention, immediately before the Schottky barrier rectifier does an OFF-action, i.e. a short time of several hundreds of nanoseconds to several microseconds (indicated as "γ" in FIG. 3B) before this OFF-action, the voltage Vg is given to the gate, to disconnect the second diffusion region 4 from the first diffusion region 3. This results in a drop in the potential of the semiconductor region 2 below the second diffusion region 4, leading to no injection of holes. Thus, the conductivity modulation effect comes to a halt and the action transits from a bipolar manner to a unipolar manner. Consequently, the excess carrier concentration in the semiconductor region 2, lowers. In the present invention, the rectifier makes an OFF-action in a state in which the number of carriers in the semiconductor region 2 is small. Hence, the reverse current Ir of FIG. 3C, a current of excess carriers, decreases compared with conventional diodes, and the reverse recovery time tr during which the Ir flows becomes shorter than in conventional diodes.

After disconnection of the second diffusion region 4, the conductivity modulation effect decreases. Thus, the forward voltage Vn of the Schottky barrier rectifier increases within the short time τ as illustrated in FIG. 3C. As the current I decreases due to an external circuit, and the number of excess carriers within the semiconductor region 2 decreases before the application of the reverse bias. Because of this mechanism, the rectifier of the present invention allows the reverse current Ir to decrease to a level not greater than a fraction of the conventional level, and the reverse recovery time tr to shorten. Hence, the switching loss, which is the time integral of the product of the transient voltage Vt (that form of voltage V present transiently until it turns into the reverse voltage Vr) and the reverse current Ir, decreases to about a fraction of the conventional level.

Embodiments of the present invention will be described with reference to the appended drawings. FIG. 4 is a cross-sectional view showing the structure of a first embodiment of an injection control type Schottky barrier rectifier in accordance with the present invention. The structure shown in FIG. 4 corresponds to the structure shown in FIG. 3A.

An n− type semiconductor region 2 is epitaxially grown on an n+ type semiconductor (for example, silicon) substrate 1. When the withstanding reverse voltage of the rectifier is 200 V or more, this semiconductor region 2 should better have a considerably high specific resistance of several Ωcm or more, e.g. 5–50 Ωcm, and a thickness of several tens of μm. A p type impurity ions (e.g. boron) are implanted with a dose of $1 \times 10^{14}$ cm$^{-2}$ and diffused by heating of 1,100° C. for 5 hours to form a second diffusion region 4 and then same impurity ions are implanted with the same dose and diffused or driven-in by heating of 1,100° C. for 1 hours to form a first diffusion region 3. The impurity concentrations of both diffusion regions are each, say, $10^{19}$ atoms/cm$^3$. Their dimensions are, for example, a depth of 1–2 μm for the first diffusion region 3, and a greater depth of 4–6 μm for the second diffusion region 4. The distance between both diffusion regions, i.e. the channel length of the field effect transistor, should be minimized in order to reduce its ON-resistance, and should desirably be, say, 5

μm or less, especially 1–2 μm. In the actual chip 10 for a rectifier, the illustrated structure is repeated in the right-left direction of the drawing in accordance with the current-carrying capacity required.

On the upper surface of the semiconductor region 2 between the p type first and second diffusion regions 3, 4 is disposed a gate 6 of polycrystalline silicon via a very thin gate oxide film 5 with a thickness of 60–100 nm. Then, an interlayer insulator 7 with a thickness of about 1 μm of phosphosilicate glass or the like is formed so as to cover the entire surface of the gate 6, and windows are formed by photoetching. Then, a barrier electrode 20 with a thickness of 2–3 μm of a barrier metal, such as chromium, titanium or aluminum is formed by, say, vacuum evaporation, over the entire surface of the rectifier so as to form a Schottky barrier junction with the semiconductor region 2 in the window and a conductive connection with the first diffusion region 3. On the back side of the rectifier is formed an electrode membrane 8 of, say, Ti/Ni/Ag in the order from the substrate to complete the illustrated structure. The control terminal G for gate 6 illustrated in FIG. 3A is led from a site other than the cross-section of FIG. 4, and so is not shown in FIG. 4. The actions of the rectifier of the structure shown in FIG. 4 are as explained already with reference to FIGS. 3A to 3C.

With this rectifier structure, however, as seen from FIG. 3A, carriers such as electrons, e, moving from below the second diffusion region 4 toward Schottky barrier junction in the ON state tend to flow slightly attracted to the first diffusion region 3. Because of the potential drop in this passageway, the injection of holes from the first region 3 into the semiconductor region 2 does not vanish completely under the condition of large current density.

Figure 5:
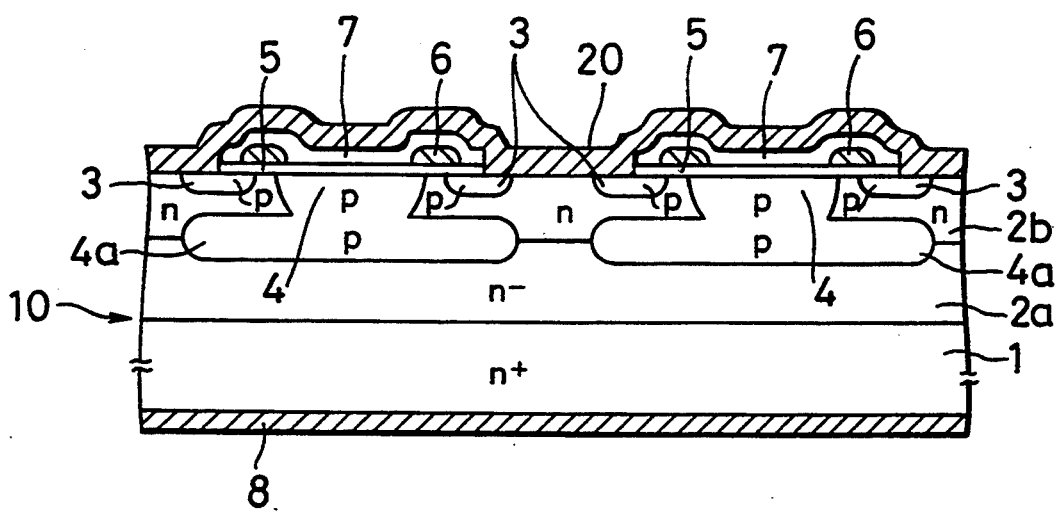
FIG. 5 is a partially enlarged cross-sectional view of a rectifier showing another embodiment of the present invention.

FIG. 5 shows an embodiment for resolving this drawback. Below the second diffusion region 4 is provided a buried layer 4a of the same p type continuous with the second diffusion region 4. As illustrated, the buried layer 4a extends so as to cover the first diffusion region 3 from below. To achieve this construction, a lower epitaxial layer 2a is grown on a substrate 1. After buried layer 4a is formed by selectively implanting ions (for example boron) in an n− epitaxial layer 2a and diffused or driven-in, an upper epitaxial layer 2b is grown. Then, an impurity is deeply diffused to make the second diffusion region 4 contiguous to the buried layer 4a.

With the structure of FIG. 5, conductivity modulation occurs within the semiconductor region 2a below the buried layer 4a. Carriers flow directly from this region 2a into the Schottky barrier junction present between the adjacent first diffusion regions 3. In this embodiment, therefore, even when the second diffusion region 4 and the first diffusion region 3 are electrically disconnected immediately before the OFF-action of the Schottky barrier rectifier, the injection of holes from the first diffusion region 3 does not occur, nor does the conductivity modulation effect occur within the semiconductor region 2b below the first diffusion region 3. Hence, the effect of the present invention to decrease reverse recovery current can be enhanced further.

Figure 6:
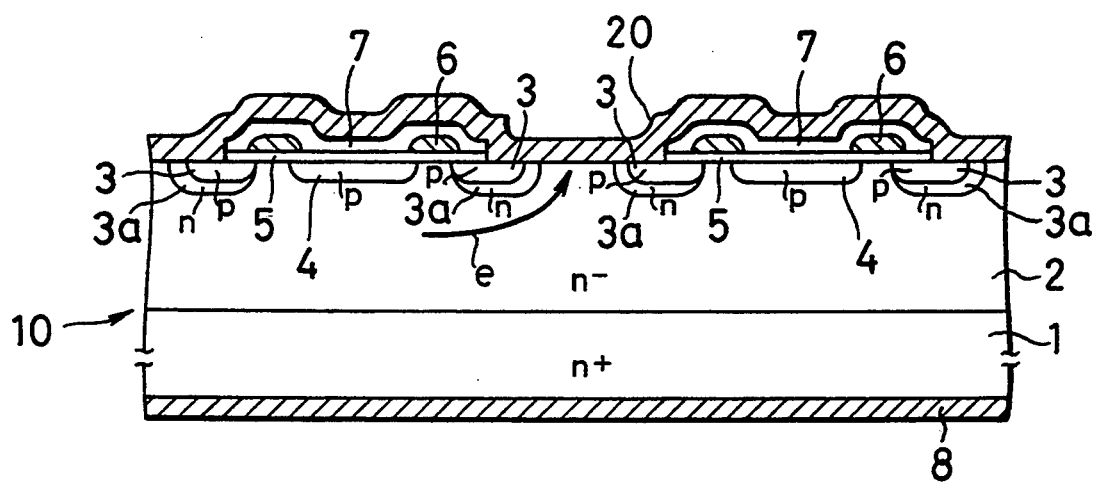
FIG. 6 is a partially enlarged cross-sectional view of a further embodiment of a Schottky barrier rectifier in accordance with the present invention.

FIG. 6 shows another embodiment of the injection control type Schottky barrier rectifier in accordance with the present invention. The arrangement of a first diffusion region 3, a second diffusion region 4, a gate 6, and a barrier membrane 20 is almost the same as the structure of FIG. 4; the differences are that the second diffusion region 4 is formed with the same depth as the first diffusion region 3, and there is an n type well 3a nearly covering the first diffusion region 3 from below. The n well 3a is formed by implanting ions (for example, arsenic) with a dose of $1 \times 10^{12} - 1 \times 10^{13}/cm^2$ and diffusing by heating of 1,100° C. for 2 hours, then the first and second diffusion regions are formed by implanting ions (boron) and diffusing by heating of 1,100° C. for 1 hours. In the present embodiment, the first diffusion region 3 and the second diffusion region 4 may have the same depth. Therefore, they should better be formed by simultaneous ion implantation using gate 6 as a mask or part of a mask and simultaneous thermal diffusion. The well 3a should be formed so as to be about 1–2 μm deeper than the first diffusion region 3, to be of an n type, opposite to the p type of the first diffusion region 3, and to have an impurity concentration of about $10^{19}$ atoms/$cm^3$ or higher. Moreover, the well 3a should be formed so as to have a pattern which does not overlap that peripheral edge of the first diffusion region 3 which faces the second diffusion region 4.

With the Schottky barrier diode of the structure shown in FIG. 6, when the rectifier is on, the channel below the gate 6 is rendered conductive so that conductivity modulation is caused within the semiconductor region 2 below the second diffusion region 4, whereby the forward voltage is reduced. At this time, an electric current flowing from the region 2 toward the barrier electrode 20 passes laterally below the first diffusion region 3. However, the n type well 3a with a higher impurity concentration and a lower specific resistance than the semiconductor region 2 covers the first diffusion region 3 from below. Therefore, there is little injection of holes from the first diffusion region 3. Then, the channel below the gate 6 is brought to a non-conducting state immediately before the OFF-action, whereby the second diffusion region 4 is disconnected from the first diffusion region 3. Hence, even when holes are injected into the semiconductor region 2 immediately thereafter, the potential of the second diffusion region 4 becomes equal to that of the semiconductor region 2 at once, and the injection stops. As a result, the conductivity modulation effect of the semiconductor region 2 terminates. Since the Schottky barrier rectifier does an OFF-action with the number of carriers in the semiconductor region 2 being decreased, its reverse recovery current decreases.

Figure 7:
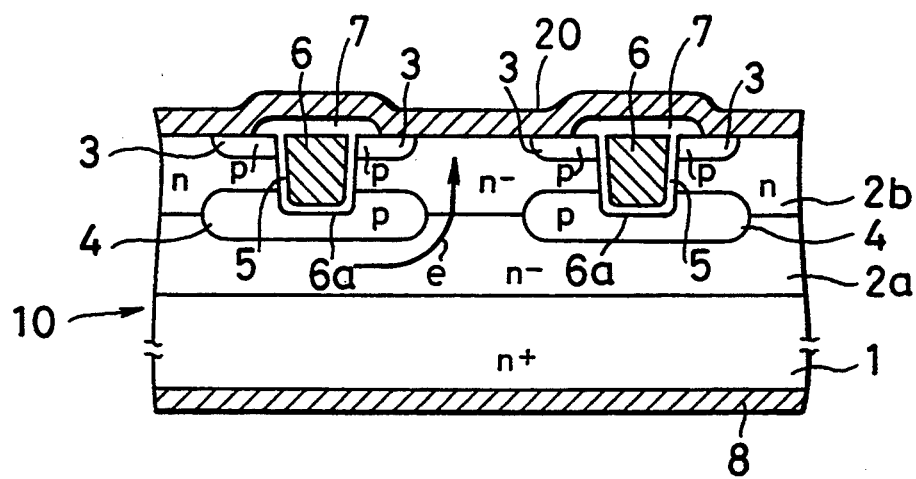
FIG. 7 is a partially enlarged cross-sectional view of a still further embodiment of a Schottky barrier rectifier in accordance with the present invention.

FIG. 7 shows still another embodiment of injection control type the Schottky barrier rectifier in accordance with the present invention. An n− type epitaxial layer 2a is grown to a predetermined thickness of several tens of μm on an n+ type substrate 1 for a chip 10. In the surface of the epitaxial layer 2a is formed a p type second region 4 as a buried layer, for example, by an ion implantation and a diffusion processes. Then, an n− type epitaxial layer 2b is grown to a thickness of several μm on the second diffusion region 4, to make a wafer for chip 10. Then, in that portion of the surface of the epitaxial layer 2b which corresponds to the second diffusion region 4 is formed a p type first diffusion region 3 with almost the same pattern as the second diffusion region 4. Afterwards, a trench 6a is dug, for example, by ion etching, from the surface of the first diffusion region 3 to a width of several μm as far as the second diffusion region 4 as shown in the drawing. A gate insulator film 5 is coated onto the trench surface.

In the present embodiment, a gate 6 is formed within the trench 6a. For this purpose, polycrystalline silicon is grown on the entire surface, including trench 6a, of the wafer for chip 10. Then, the polycrystalline silicon is removed by etch back from the surface of the chip 10, except the portion inside the trench 6a for the gate 6. After an interlayer insulator film 7 such as an oxide is applied so as to cover the gate 6, a barrier electrode 20 is formed on the surface of the chip 10 so as to be conductively connected with the first diffusion region 3 and to form a Schottky barrier junction with the semiconductor region 2b surrounding the first diffusion region 3. On the back surface of the chip 10 is formed an electrode membrane 8 to complete the illustrate structure. In this state, the channel of a field effect transistor is formed at that portion of the semiconductor region 2b which is contiguous to the gate insulator film 5.

The injection control type Schottky barrier rectifier of the structure shown in FIG. 7 performs the same actions as described in the embodiments of FIGS. 4 to 6. When the Schottky barrier rectifier is on, the channel becomes conducting, and the semiconductor region 2a below the second diffusion region 4 becomes firstly the conductivity modulation state. An electric current going from the region 2a toward the barrier electrode 20 flows beside the first diffusion region 3 as illustrated. Therefore, there is little injection of holes from the first diffusion region 3 into the semiconductor region 2b as in the case of FIG. 5. Then, the channel is brought to a non-conducting state immediately before the OFF-action of the rectifier so that the number of carriers in the semiconductor region 2a is decreased, whereby the reverse recovery current during the OFF-action is decreased. In the present embodiment, the number of steps for making the rectifier increases since the trench 6a is formed to accommodate the gate 6. As illustrated, however, the area of the chip required for the formation of the gate 6 can be decreased.

As described above, the injection control type Schottky barrier rectifier of the present invention has first and second diffusion regions, connectable and disconnectable from each other by gate control, formed in a semiconductor region. The first diffusion region is provided with the effect of forming a depletion zone. The second region is provided with the effect of causing conductivity modulation. In the ON state of the rectifier, the first and second diffusion regions are electrically connected to maintain the conductivity modulation effect within the semiconductor region below the second region. Immediately before the OFF-action of the rectifier, the second diffusion region is electrically separated from the first diffusion region to terminate conductivity modulation, thereby decreasing the number of carriers within the semiconductor region. Subsequently, the OFF-action of the rectifier is performed, whereby the following effects can be achieved:

(a) Reverse current flowing in the rectifier during its OFF-action is decreased to less than a fraction of the value of a conventional diode. Reverse recovery time is shortened in response to this decrease. Hence, the switching loss, which is the integral of the product of the reverse current and transient voltage during the reverse recovery time, is decreased to a fraction of the conventional level, and the range of frequencies where the rectifier with a high withstanding voltage is applicable can be widened to a higher frequency range.

(b) Because of the decrease in reverse current, a sharp rise in transient voltage due to floating inductance within the circuit to which the rectifier is connected is curbed, thus minimizing the risks of an erroneous circuit action, damage of the elements or noise generation.

(c) A depletion zone is formed by the first diffusion region to raise the value of withstanding voltage during the OFF-action, while conductivity modulation is caused by the second diffusion region to decrease the forward voltage during the ON-action. Hence, a Schottky barrier rectifier can be provided which has a withstanding voltage of 200 V or more, which has a forward voltage of about 2-3 V even at a current-carrying capacity of 200 A or more, and which is suitable for power supply.

The present invention has been described in detail with respect to preferred embodiments, and it will now be that changes and modifications may be made without departing from the invention in its broader aspects, and it is the intention, therefore, the appended claims to cover all such changes and modifications as fall within the true spirit of the invention.

What is claimed is:

1. An injection control-type Schottky barrier rectifier, comprising:

a semiconductor region having a first conductivity type;

a first diffusion region, which is formed in the semiconductor region and which has a second conductivity type, the second conductivity type being different from the first conductivity type, for forming a depletion layer in the semiconductor region when a turn-off voltage is applied to the Schottky barrier rectifier;

a second diffusion region, which is formed in the semiconductor region and which has the second conductivity type, for causing conductivity modulation in the semiconductor region when a turn-on voltage is applied to the Schottky barrier rectifier;

a barrier electrode which is ohmically connected with the first diffusion region and which forms a Schottky junction with the surface of the semiconductor region which is opposite to the second diffusion region with respect to the first diffusion region;

a gate insulator film formed on the surface of the semiconductor region between the first diffusion region and the second diffusion region;

a gate electrode disposed in contact with the gate insulator film;

a control terminal which is connected with the gate electrode and which applies a negative gate voltage to the gate electrode to electrically connect the first and second diffusion regions to each other or a positive gate voltage to the gate electrode to electrically disconnect the first and second diffusion regions from each other;

a main terminal connected to the barrier electrode; and a metal electrode disposed on the back surface of a semiconductor substrate of the first conductivity type, said semiconductor substrate formed directly on the back surface of the semiconductor region.

2. The injection control-type Schottky barrier rectifier as claimed in claim 1, wherein a plurality of transistors formed in the semiconductor region, each transistor comprises the first diffusion region, the second diffusion region, the gate electrode, the semiconductor region and the control terminal form.

3. The injection control-type Schottky barrier rectifier as claimed in claim 1, wherein the first diffusion region, the second diffusion region, the gate electrode, and the semiconductor region below the gate electrode constitute a field effect transistor.

4. The injection control-type Schottky barrier rectifier as claimed in claim 3, wherein the semiconductor region in the vicinity of the gate electrode forms a channel having a length of 5 $\mu$m or less.

5. The injection control-type Schottky barrier rectifier as claimed in claim 4, wherein the length of the channel is 2 $\mu$m or less.

6. The injection control-type Schottky barrier rectifier as claimed in claim 3, wherein the semiconductor region in the vicinity of the gate electrode forms a channel, wherein, when a turn-on voltage is applied to the Schottky barrier rectifier, the negative gate voltage for making the channel conductive is applied to the gate electrode; and wherein, before the Schottky barrier rectifier does an OFF-action, the positive gate voltage for bringing the channel to a non-conducting state is applied to the gate electrode.

7. The injection control-type Schottky barrier rectifier as claimed in claim 1, wherein the semiconductor region is made of n-type silicon, and the first and second diffusion regions are each made of p-type silicon.

8. The injection control-type Schottky barrier rectifier as claimed in claim 1, wherein the barrier electrode is a composite membrane comprised of a barrier metal selected from the group consisting of chromium, titanium, and aluminum.

9. The injection control-type Schottky barrier rectifier as claimed in claim 1, wherein the first and second diffusion regions each have a depth, and wherein the depth of the second diffusion region is greater than the depth of the first diffusion region.

10. The injection control-type Schottky barrier rectifier as claimed in claim 9, wherein a buried layer of the second conductivity type continuous with the second diffusion region is provided in the semiconductor region so as to nearly cover the first diffusion region from below via the semiconductor region.

11. The injection control-type Schottky barrier rectifier as claimed in claim 1, wherein the first and second diffusion regions each have a depth, wherein the depth of the first diffusion region and the second diffusion region are substantially the same, wherein a well layer having the first conductivity type and having an impurity concentration is provided below the first diffusion region so as to cover all of the undersurface of the first diffusion region except the side surface of the first diffusion region which is opposite to the second diffusion region, and wherein the well layer has a higher impurity concentration than that of the semiconductor region.

12. The injection control-type Schottky barrier rectifier as claimed in claim 1, wherein the second diffusion region is a buried layer formed in the semiconductor region, wherein the first diffusion region is formed above the second diffusion region via the semiconductor region, wherein a trench having side surfaces and a bottom surface is formed in the semiconductor region so as to reach the second diffusion region, wherein the gate insulator film is an oxide formed on the side surfaces and bottom surface of the trench, and wherein the gate electrode fills the trench.

* * * * *